United States Patent
Wang

(10) Patent No.: US 10,163,580 B2
(45) Date of Patent: Dec. 25, 2018

(54) OLED DEVICE AND METHOD FOR MANUFACTURING THE SAME

(71) Applicant: WUHAN CHINA STAR OPTOELECTRONICS TECHNOLOGY CO., LTD., Wuhan, Hubei (CN)

(72) Inventor: Xu Wang, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/574,333

(22) PCT Filed: Jun. 22, 2017

(86) PCT No.: PCT/CN2017/089608
§ 371 (c)(1),
(2) Date: Nov. 15, 2017

(65) Prior Publication Data
US 2018/0323014 A1    Nov. 8, 2018

(51) Int. Cl.
| H01L 51/50 | (2006.01) |
| H01G 9/28 | (2006.01) |
| H01L 51/00 | (2006.01) |
| H01G 9/20 | (2006.01) |
| H01L 51/42 | (2006.01) |

(52) U.S. Cl.
CPC ............ *H01G 9/28* (2013.01); *H01G 9/2059* (2013.01); *H01L 51/0059* (2013.01); *H01L 51/0072* (2013.01); *H01L 51/0077* (2013.01); *H01L 51/4246* (2013.01); *H01L 51/5004* (2013.01); *H01L 51/5012* (2013.01); *H01L 51/5016* (2013.01)

(58) Field of Classification Search
CPC .................................................. H01L 51/5084
See application file for complete search history.

(56) References Cited

U.S. PATENT DOCUMENTS

2017/0222162 A1* 8/2017 Lee .................... H01L 51/0077
2017/0346031 A1   11/2017 Lee et al.

FOREIGN PATENT DOCUMENTS

| CN | 103681774 A | 3/2014 |
| CN | 104051629 A | 9/2014 |
| CN | 104795505 A | 7/2015 |
| CN | 105938845 A | 9/2016 |
| CN | 106187892 A | 12/2016 |
| WO | 2016072810 A1 | 5/2016 |

* cited by examiner

*Primary Examiner* — Cheung Lee
(74) *Attorney, Agent, or Firm* — Ladas & Parry LLP

(57) ABSTRACT

An OLED device and a method for manufacturing the OLED device are provided. The OLED device includes a substrate, a first electrode layer, an electron injection layer, an electron transport layer, a photoactive layer, a hole transport layer, and a second electrode layer, which are sequentially disposed on the substrate. The photoactive layer includes an exciton control layer and an active material layer, the active material layer includes a perovskite material and a small molecule luminescent material, and a doping molar ratio of the small molecular luminescent material ranges from 0.1% to 15%.

13 Claims, 1 Drawing Sheet

OLED DEVICE AND METHOD FOR MANUFACTURING THE SAME

FIELD OF THE INVENTION

The present disclosure relates to the technical field of electroluminescent devices, and more particularly to an OLED device having a dual-function of electroluminescence and photoelectric conversion, and a method for manufacturing the OLED device.

BACKGROUND OF THE INVENTION

Organic optoelectronic devices are receiving increased attention, especially organic light emitting devices, also known as organic light emitting diodes, and referred to as OLED. Due to a variety of excellent characteristics, such as solid-state lighting, wide viewing angles, a wide gamut, low power consumption, fast response, high and low temperature resistance, being light weight, being thin, having the ability to be curled, etc., OLEDs are suitably used for meeting low-carbon environmental protection and green lifestyle requirements in today's world, and have been widely used in daily products and daily life in various fields, such as flat panel displays and solid-state lighting.

In recent years, wearable electronic devices using OLED screens, like smart watches, smart bracelets, smart glasses, and so on, are being increasingly favored by consumers. These devices have a common feature, that is, high integration of functions. In addition to a display function, theses devices usually have other practical functions, which are normally fulfilled by integrating other components into the terminals, and this fact is disadvantageous to reducing the terminal size.

Furthermore, the conventional organic optoelectronic devices also have some problems: the conventional organic optoelectronic devices only have a single function, and are disadvantageous to the formation of multi-functional organic flexible integrated circuits. For example, the conventional OLEDs only have the electroluminescence function, but do not have the photoelectric conversion function.

Therefore, it is necessary to provide an OLED device and a method for manufacturing the OLED device to solve the problems existing in the prior art.

SUMMARY OF THE INVENTION

An object of the present disclosure is to provide an OLED device and a method for manufacturing the OLED device, which fulfill the functions of both electroluminescence and photoelectric conversion in a single device.

The present disclosure provides an OLED device, comprising: a substrate, a first electrode layer, an electron injection layer, an electron transport layer, a photoactive layer, a hole transport layer, and a second electrode layer, which are sequentially disposed on the substrate;

wherein the photoactive layer includes an exciton control layer and an active material layer, the active material layer includes a perovskite material and a small molecule luminescent material, and a doping molar ratio of the small molecular luminescent material ranges from 0.1% to 15%;

wherein the perovskite material is a material of Formula I: $ABX_3$, wherein A is an organic ammonium group, B is a Group IV metal or a transition metal, and X is a halogen element or a combination of a plurality of halogen elements; and wherein the small molecule luminescent material is a fluorescent material or a phosphorescent material.

In the OLED device of the present disclosure, a material of the exciton control layer is an electron transport type material, an energy level of the electron transport type material is between an energy level of a material of the electron transport layer and an energy level of a material of the active material layer, and the exciton control layer is located between the electron transport layer and the active material layer.

In the OLED device of the present disclosure, a material of the exciton control layer is a hole transport type material, an energy level of the hole transport type material is between an energy level of a material of the hole transport layer and an energy level of a material of the active material layer, and the exciton control layer is located between the hole transport layer and the active material layer.

The present disclosure further provides an OLED device, comprising: a substrate, a first electrode layer, an electron injection layer, an electron transport layer, a photoactive layer, a hole transport layer, and a second electrode layer, which are sequentially disposed on the substrate;

wherein the photoactive layer includes an exciton control layer and an active material layer, the active material layer includes a perovskite material and a small molecule luminescent material, and a doping molar ratio of the small molecular luminescent material ranges from 0.1% to 15%.

In the OLED device of the present disclosure, a material of the exciton control layer is an electron transport type material, an energy level of the electron transport type material is between an energy level of a material of the electron transport layer and an energy level of a material of the active material layer, and the exciton control layer is located between the electron transport layer and the active material layer.

In the OLED device of the present disclosure, a material of the exciton control layer is a hole transport type material, an energy level of the hole transport type material is between an energy level of a material of the hole transport layer and an energy level of a material of the active material layer, and the exciton control layer is located between the hole transport layer and the active material layer.

In the OLED device of the present disclosure, the perovskite material is a material of Formula I: $ABX_3$, wherein A is an organic ammonium group, B is a Group IV metal or a transition metal, and X is a halogen element or a combination of a plurality of halogen elements.

In the OLED device of the present disclosure, the small molecule luminescent material is a fluorescent material or a phosphorescent material.

To achieve the above object of the present disclosure, the present disclosure provides a method for manufacturing an OLED device, comprising steps of:

providing a substrate;

forming a first electrode layer, an electron injection layer, an electron transport layer, a photoactive layer, a hole transport layer, and a second electrode layer sequentially on a substrate;

wherein the photoactive layer includes an exciton control layer and an active material layer, the active material layer includes a perovskite material and a small molecule luminescent material, and a doping molar ratio of the small molecular luminescent material ranges from 0.1% to 15%.

In the method for manufacturing the OLED device of the present disclosure, when a material of the exciton control layer is an electron transport type material, an energy level of the electron transport type material is between an energy level of a material of the electron transport layer and an energy level of a material of the active material layer, and the step of forming the photoactive layer includes steps of:

forming the exiton control layer on the electron transport layer; and forming the active material layer on the exiton control layer.

In the method for manufacturing the OLED device of the present disclosure, when a material of the exciton control layer is a hole transport type material, an energy level of the hole transport type material is between an energy level of a material of the hole transport layer and an energy level of a material of the active material layer, and the step of forming the photoactive layer includes steps of:

forming the active material layer on the electron transport layer, and forming the exiton control layer on the active material layer.

In the method for manufacturing the OLED device of the present disclosure, the perovskite material is a material of Formula I: $ABX_3$, wherein A is an organic ammonium group, B is a Group IV metal or a transition metal, and X is a halogen element or a combination of a plurality of halogen elements.

In the method for manufacturing the OLED device of the present disclosure, the small molecule luminescent material is a fluorescent material or a phosphorescent material.

In the OLED device and the method for manufacturing the OLED device of the present disclosure, the functions of both electroluminescence and photoelectric conversion in a single device are fulfilled by using the photoactive layer composed of the exciton control layer and the active material layer, material of which includes the perovskite material and the small molecule luminescent material. The integration of the functions of the device is substantially improved, the duration of the manufacturing process is shortened, the manufacturing cost is substantially reduced, and the electroluminescent performance is significantly enhanced.

To make the present disclosure clearly understood, the preferred embodiments are given hereinafter and are to be described in detail with reference to the accompanying drawings.

BRIEF DESCRIPTION OF THE DRAWINGS

The technical aspects of the present disclosure and other advantageous effects will be apparent through the following detailed description of a specific embodiment of the disclosure taken in conjunction with the accompanying drawings.

DETAILED DESCRIPTION OF THE PREFERRED EMBODIMENTS

The technical means and the effects thereof will be described in further detail with reference to the preferred embodiment of the present disclosure and the accompanying drawings thereof. Obviously, the described embodiments are merely part of the present disclosure, rather than all embodiments. Based on embodiments in the present disclosure, all other embodiments obtained by a person of ordinary skill in the art without making creative work are within the scope of the present disclosure.

Figure 1:
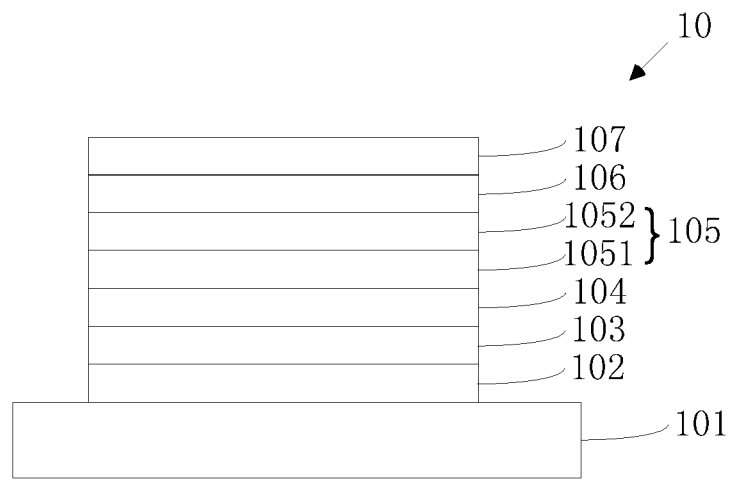
FIG. 1 is a schematic diagram of a first structure of an OLED device provided in a preferred embodiment of the present disclosure.
Figure 2:
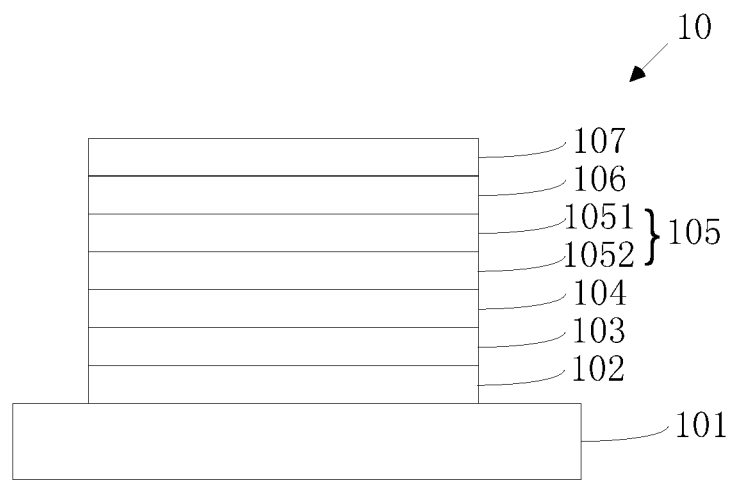
FIG. 2 is a schematic diagram of a second structure of the OLED device provided in the preferred embodiment of the present disclosure.

Refer to FIG. 1 and FIG. 2. FIG. 1 is a schematic diagram of a first structure of an OLED device provided in a preferred embodiment of the present disclosure. FIG. 2 is a schematic diagram of a second structure of the OLED device provided in the preferred embodiment of the present disclosure. As shown in FIG. 1 and FIG. 2, the OLED device 10 of the present disclosure includes a substrate 101, a first electrode layer 102, an electron injection layer 103, an electron transport layer 104, a photoactive layer 105, a hole transport layer 106, and a second electrode layer 107, which are sequentially disposed on the substrate 101, wherein the photoactive layer 105 includes an exciton control layer 1051 and an active material layer 1052. The active material layer 1052 includes a perovskite material and a small molecule luminescent material, and a doping molar ratio of the small molecular luminescent material ranges from 0.1% to 15%.

As shown in FIG. 1, when material of the exciton control layer 1051 is an electron transport type material, an energy level of the electron transport type material is between an energy level of material of the electron transport layer 104 and an energy level of material of the active material layer 1052. The exciton control layer 1051 is located between the electron transport layer 104 and the active material layer 1052.

As shown in FIG. 2, when material of the exciton control layer 1051 is a hole transport type material, an energy level of the hole transport type material is between an energy level of material of the hole transport layer 106 and an energy level of material of the active material layer 1052. The exciton control layer is 1051 located between the hole transport layer 106 and the active material layer 1052.

In the OLED device 10 of the present preferred embodiment, position of the exciton control layer 1051 and the active material layer 1052 in the OLED device 10 is based upon the material used in the exciton control layer, for further improving effects of electroluminescence and photoelectric conversion of the OLED device 10.

The OLED device 10 of the present preferred embodiment fulfills the functions of both electroluminescence and photoelectric conversion in a single device by using the perovskite material, the small molecule luminescent material, and the active layer 105 composed of an exciton control layer.

Specifically, the operation principle of the OLED device 10 is as follows: when the potential applied to the second electrode layer 107 is higher than the potential applied to the first electrode layer 102, the holes pass from the second electrode layer 107 through the hole transport layer 106 to the photoactive layer 105, and the electrons pass from the first electrode layer 102 through the electron injection layer 103 and the electron transport layer 104 to the photoactive layer 105 for recombining the electrons with the holes to form excitons. The excitons are deactivated to radiate light, and the device is in an electroluminescence mode at this moment. The potential applied to the second electrode layer 107 is lower than the potential applied to the first electrode layer 102, excitons are generated in the photoactive layer 105 under the irradiation of outside light in a specific band. The excitons are separated into holes and electrons under the electric field generated by the first electrode layer 102 and the second electrode layer 107. The holes pass through the hole transport layer 106 to the second electrode layer 107, and the electrons pass through the electron transport layer

104 to the first electrode layer 102, to generate currents. The device is in a photoelectric conversion at this moment.

The materials used in each of the layers of the preferred embodiment of the present disclosure are described in detail below. The materials used in each of the layers can be reasonably selected as desired.

The perovskite material is a material of Formula I: $ABX_3$, wherein A is an organic ammonium group, B is a Group IV metal or a transition metal, and X is a combination of a halogen element or a plurality of halogen elements. Furthermore, A may be any one of alkylamine, aromatic amine, and diamine. B may be any one of Group IV metals, such as Pb, Ge, and Sn, and any one of transition metals Cu, Ni, Co, $Fe_2$, Mn, and Eu. X may be any one of a halogen element, such as Cl, Br, and I. X may also be a combination of a plurality of halogen elements, which have the following structural formula: $Cl_xBr_yI_z$, $x+y+z=3$. The luminescent light color and the corresponding band of the photoelectric conversion of the OLED device of the present preferred embodiment can be adjusted by selecting the active material. The perovskite material can be selected as desired. Preferably, the perovskite material is $CH_3NH_3PbBr_3$.

The small molecule luminescent material may be a fluorescent material or a phosphorescent material. The doping molar ratio of the small molecular luminescent material in the photoactive layer ranges from 0.1% to 15%.

The substrate may be a transparent substrate, a glass substrate, or a flexible substrate. The flexible substrate may be one of a polyester and a polyimide-based compound.

The first electrode layer is made by a metal having a low work function, such as lithium, magnesium, calcium, strontium, aluminum, and indium, made by the alloy thereof doped with copper, gold, and silver, or made by an electrode layer which is alternately formed by a metal and a metal fluoride, such as an Mg—Ag alloy layer with an Ag layer, a lithium fluoride or lithium nitride layer with an Ag layer, and a lithium fluoride or lithium nitride layer with an Al layer. One of the inorganic materials, like tin doped indium oxide (ITO) and fluorine doped tin oxide (FTO) and the transparent conductive polymers, like poly(3,4-ethylenedioxythiophene) polystyrene sulfonate (PEDOT:PSS), and polyaniline (PANI) may be used.

The electron injection layer is one of graphene, carbon nanotube, ZnO, $TiO_2$ and $Cs_2CO_3$.

The electron transport layer may be 4,7-diphenyl-1,10-phenanthroline (Bphen), 1,3,5-tris (N-phenylbenzimidazol-2-yl) benzene (TPBi), bathocuproine (BCP), and tris (8-quinolinolato) aluminum (Alq3).

The hole transport layer is any one of an aromatic diamine compound, an aromatic triamine compound, a carbazole compound, a triphenylamine compound, a furan compound, a spiro-type structural compound, and a polymer material.

The second electrode layer is made by a metal having a high work function, such as copper, gold, and silver, made by an alloy thereof, or made by an electrode layer which is alternately formed by a metal and a metal oxide, such as ITO/Ag/ITO. One of the inorganic materials, like ITO, and the transparent conductive polymers, like PEDOT:PSS, and PANI may be used.

In the OLED device of the present disclosure, the functions of both electroluminescence and photoelectric conversion in a single device are fulfilled by using the photoactive layer composed of the exciton control layer and the active material layer, material of which includes the perovskite material and the small molecule luminescent material. The integration of the functions of the device is substantially improved, the duration of the manufacturing process is shortened, the manufacturing cost is substantially reduced, and the electroluminescent performance is significantly enhanced.

The present disclosure provides a method for manufacturing the OLED device comprising the following steps of forming a first electrode layer, an electron injection layer, an electron transport layer, a photoactive layer, a hole transport layer, and a second electrode layer sequentially on a substrate wherein the photoactive layer includes an exciton control layer and an active material layer, the active material layer includes a perovskite material and a small molecule luminescent material, and a doping molar ratio of the small molecular luminescent material ranges from 0.1% to 15%.

When material of the exciton control layer is an electron transport type material, an energy level of the electron transport type material is between an energy level of material of the electron transport layer and an energy level of material of the active material layer, and the step of forming the photoactive layer includes steps of forming the exiton control layer on the electron transport layer, and forming the active material layer on the exiton control layer.

When material of the exciton control layer is a hole transport type material, an energy level of the hole transport type material is between an energy level of material of the hole transport layer and an energy level of material of the active material layer, and the step of forming the photoactive layer includes steps of: forming the active material layer on the electron transport layer, and forming the exiton control layer on the active material layer.

During the manufacture of the OLED device, the substrate may be a glass substrate, the first electrode layer may be formed by ITO, the electron injection layer may be formed by ZnO, and the electron transport layer may be formed by 1,3,5-tris (N-phenylbenzimidazole-2-yl) benzene (TPBi), the active material layer may be formed by $CH_3NH_3PbBr_3$ doped with the small molecule luminescent material, the exciton control layer may be formed by 4, 4', 4"-tris (carbazole-9-yl) triphenylamine (TCTA), the hole transport layer may be formed by N,N'-diphenyl-N,N'-bis (I-naphthyl)-1,1'-biphenyl-4,4"-diamine (NPB), and the second electrode layer may be formed by Au.

Specifically, the glass substrate coated with the ITO transparent conductive layer is first sonicated in a commercial cleaning agent, rinsed in deionized water, sonicated in an isopropanol solvent, dried in a clean environment to completely remove moisture, and then cleaned with ultraviolet light and ozone. The surface thereof is bombarded with low energy oxygen plasma.

The ZnO precursor solution is then prepared on the substrate by spin coating and then annealed in air at 200° C. for 1 hour to form the electron injection layer.

Then, the glass substrate with the electron injection layer is placed in a vacuum chamber and evacuated to $2 \times 10^{-4}$ Pa or less. TPBi is vapor-deposited under vacuum on the electron injection layer as the electron transport layer at the vapor deposition rate of 0.1 nm/s, and the thickness of the vapor deposition is 20 nm.

Afterwards, the substrate is transferred to a glove box. The small molecule luminescent material at a specific ratio is dissolved in the $CH_3NH_3PbBr_3$ solution in advance. The $CH_3NH_3PbBr_3$ solution doped with the small molecule luminescent material is spin-coated and then annealed at 90° C. for 10 minutes to form the active material layer, and is transferred to the vacuum chamber for vapor-depositing the exciton control layer, TCTA, at the vapor deposition rate of 0.05 nm/s, and the thickness of the vapor deposition is 5 nm, thus forming the photoactive layer.

Finally, NPB is vapor-deposited on the photoactive layer as the hole transport layer at a vapor deposition rate of 0.1 nm/s, and the thickness of the vapor deposition is 30 nm. Au is vapor-deposited on the hole transport layer as the second electrode layer, and the thickness of the vapor deposition is 100 nm.

Moreover, during the manufacture of the OLED device, the substrate may be a glass substrate, the first electrode layer may be formed by ITO, the electron injection layer may be formed by ZnO, and the electron transport layer may be formed by 1,3,5-tris (N-phenylbenzimidazole-2-yl) benzene (TPBi), the active material layer may be formed by $CH_3NH_3PbBr_3$ doped with the small molecule luminescent material, the exciton control layer may be formed by bathocuproine (BCP), the hole transport layer may be formed by N,N'-diphenyl-N,N'-bis(1-naphthyl)-1,1'-biphenyl-4,4"-diamine (NPB), and the second electrode layer may be formed by Au.

Specifically, the glass substrate coated with the ITO transparent conductive layer is first sonicated in a commercial cleaning agent, rinsed in deionized water, sonicated in an isopropanol solvent, dried in a clean environment to completely remove moisture, and then cleaned with ultraviolet light and ozone. The surface thereof is bombarded with low energy oxygen plasma.

The ZnO precursor solution is then prepared on the substrate by spin coating and then annealed in air at 200° C. for 1 hour to form the electron injection layer.

Then, the glass substrate with the electron injection layer is placed in a vacuum chamber and evacuated to $2\times10^{-4}$ Pa or less. TPBi is vapor-deposited under vacuum on the electron injection layer as the electron transport layer at the vapor deposition rate of 0.1 nm/s, and the thickness of the vapor deposition is 20 nm.

Afterwards, the exciton control layer, TCTA, is vapor-deposited at the vapor deposition rate of 0.05 nm/s, and the thickness of the vapor deposition is 5 nm. Subsequently, the substrate is transferred to a glove box. The small molecule luminescent material at a specific ratio is dissolved in the $CH_3NH_3PbBr_3$ solution in advance. The $CH_3NH_3PbBr_3$ solution doped with the small molecule luminescent material is spin-coated and then annealed at 90° C. for 10 minutes to form the active material layer, and finally form the photoactive layer 5.

Finally, NPB is vapor-deposited on the photoactive layer 5 as the hole transport layer 6 at a vapor deposition rate of 0.1 nm/s, and the thickness of the vapor deposition is 30 nm. Au is vapor-deposited on the hole transport layer 6 as the second electrode layer 7, and the thickness of the vapor deposition is 100 nm.

The OLED device formed by the method for manufacturing the OLED device of the present disclosure is the same as the OLED device described in the above embodiment. For details, refer to the OLED device in the above preferred embodiments, they will not be redundantly described.

In the OLED device and the method for manufacturing the OLED device of the present disclosure, the functions of both electroluminescence and photoelectric conversion in a single device are fulfilled by using the photoactive layer composed of the exciton control layer and the active material layer, material of which includes the perovskite material and the small molecule luminescent material. The integration of the functions of the device is substantially improved, the duration of the manufacturing process is shortened, the manufacturing cost is substantially reduced, and the electroluminescent performance is significantly enhanced.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. An organic light emitting diode (OLED) device, comprising:
    a substrate, a first electrode layer, an electron injection layer, an electron transport layer, a photoactive layer, a hole transport layer, and a second electrode layer, which are sequentially disposed on the substrate;
    wherein the photoactive layer includes an exciton control layer and an active material layer, the active material layer includes a perovskite material and a small molecule luminescent material, and a doping molar ratio of the small molecular luminescent material ranges from 0.1% to 15%;
    wherein the perovskite material is a material of Formula I: $ABX_3$
    wherein A is an organic ammonium group, B is a Group IV metal or a transition metal, and X is a halogen element or a combination of a plurality of halogen elements; and
    wherein the small molecule luminescent material is a fluorescent material or a phosphorescent material.

2. The OLED device as claimed in claim 1, wherein a material of the exciton control layer is an electron transport type material, an energy level of the electron transport type material is between an energy level of a material of the electron transport layer and an energy level of a material of the active material layer, and the exciton control layer is located between the electron transport layer and the active material layer.

3. The OLED device as claimed claim 1, wherein a material of the exciton control layer is a hole transport type material, an energy level of the hole transport type material is between an energy level of a material of the hole transport layer and an energy level of a material of the active material layer, and the exciton control layer is located between the hole transport layer and the active material layer.

4. An organic light emitting diode (OLED) device, comprising:
    a substrate, a first electrode layer, an electron injection layer, an electron transport layer, a photoactive layer, a hole transport layer, and a second electrode layer, which are sequentially disposed on the substrate;
    wherein the photoactive layer includes an exciton control layer and an active material layer, the active material layer includes a perovskite material and a small molecule luminescent material, and a doping molar ratio of the small molecular luminescent material ranges from 0.1% to 15%.

5. The OLED device as claimed in claim 4, wherein a material of the exciton control layer is an electron transport type material, an energy level of the electron transport type material is between an energy level of a material of the electron transport layer and an energy level of a material of the active material layer, and the exciton control layer is located between the electron transport layer and the active material layer.

6. The OLED device as claimed claim 4, wherein a material of the exciton control layer is a hole transport type material, an energy level of the hole transport type material is between an energy level of a material of the hole transport layer and an energy level of a material of the active material layer, and the exciton control layer is located between the hole transport layer and the active material layer.

7. The OLED device as claimed claim 4, wherein the perovskite material is a material of Formula I: $ABX_3$
wherein A is an organic ammonium group, B is a Group IV metal or a transition metal, and X is a halogen element or a combination of a plurality of halogen elements.

8. The OLED device as claimed claim 4, wherein the small molecule luminescent material is a fluorescent material or a phosphorescent material.

9. A method for manufacturing an organic light emitting diode (OLED) device comprising steps of:
providing a substrate;
forming a first electrode layer, an electron injection layer, an electron transport layer, a photoactive layer, a hole transport layer, and a second electrode layer sequentially on the substrate;
wherein the photoactive layer includes an exciton control layer and an active material layer, the active material layer includes a perovskite material and a small molecule luminescent material, and a doping molar ratio of the small molecular luminescent material ranges from 0.1% to 15%.

10. The method for manufacturing the OLED device as claimed in claim 9, wherein when a material of the exciton control layer is an electron transport type material, an energy level of the electron transport type material is between an energy level of a material of the electron transport layer and an energy level of a material of the active material layer, and the step of forming the photoactive layer includes following steps of:
forming the exiton control layer on the electron transport layer; and
forming the active material layer on the exiton control layer.

11. The method for manufacturing the OLED device as claimed in claim 9, wherein when a material of the exciton control layer is a hole transport type material, an energy level of the hole transport type material is between an energy level of a material of the hole transport layer and an energy level of a material of the active material layer, and the step of forming the photoactive layer includes steps of:
forming the active material layer on the electron transport layer; and
forming the exiton control layer on the active material layer.

12. The method for manufacturing the OLED device as claimed in claim 9, wherein the perovskite material is a material of Formula I: $ABX_3$
wherein A is an organic ammonium group, B is a Group IV metal or a transition metal, and X is a halogen element or a combination of a plurality of halogen elements.

13. The method for manufacturing the OLED device as claimed in claim 9, wherein the small molecule luminescent material is a fluorescent material or a phosphorescent material.

* * * * *